(12) United States Patent
Nakata et al.

(10) Patent No.: US 8,754,419 B2
(45) Date of Patent: Jun. 17, 2014

(54) SEMICONDUCTOR DEVICE

(75) Inventors: Ken Nakata, Kanagawa (JP); Isao Makabe, Kanagawa (JP); Keiichi Yui, Kanagawa (JP); Takamitsu Kitamura, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 13/171,627

(22) Filed: Jun. 29, 2011

(65) Prior Publication Data

US 2012/0001194 A1 Jan. 5, 2012

(30) Foreign Application Priority Data

Jun. 30, 2010 (JP) ................................. 2010-150059

(51) Int. Cl.
H01L 29/78 (2006.01)

(52) U.S. Cl.
USPC .............. 257/76; 257/E29.247; 257/E29.346; 257/E21.125; 257/E21.123; 257/E21.124

(58) Field of Classification Search
USPC .............. 257/76, E29.247, E29.246, E21.125, 257/E21.123, E21.124
See application file for complete search history.

(56) References Cited

U.S. PATENT DOCUMENTS

| | | | | |
|---|---|---|---|---|
| 6,329,305 B1 * | 12/2001 | Bower et al. | .................. | 438/800 |
| 6,475,931 B2 * | 11/2002 | Bower et al. | .................. | 438/800 |
| 6,781,164 B2 * | 8/2004 | Hori et al. | ..................... | 257/194 |
| 6,998,649 B2 * | 2/2006 | Hata | ................................ | 257/99 |
| 7,045,815 B2 * | 5/2006 | Yu et al. | ........................... | 257/43 |
| 7,105,880 B2 * | 9/2006 | Noguchi et al. | ............... | 257/295 |
| 7,211,852 B2 * | 5/2007 | Ramdani et | .................... | 257/295 |
| 7,553,370 B2 * | 6/2009 | Biwa et al. | ..................... | 117/89 |
| 7,612,361 B2 * | 11/2009 | Park et al. | ........................ | 257/13 |
| 7,728,348 B2 * | 6/2010 | Kasai et al. | .................... | 257/103 |
| 7,994,520 B2 * | 8/2011 | Kim | ................................. | 257/86 |
| 8,143,140 B2 * | 3/2012 | Kasai et al. | .................... | 438/458 |
| 8,178,899 B2 * | 5/2012 | Matsushita | .................... | 257/192 |
| 8,395,162 B2 * | 3/2013 | Nakano et al. | ................... | 257/77 |
| 8,436,362 B2 * | 5/2013 | Park | ................................ | 257/76 |
| 8,546,813 B2 * | 10/2013 | Makabe et al. | ................. | 257/76 |
| 2004/0079964 A1 * | 4/2004 | Hori et al. | ...................... | 257/194 |

(Continued)

FOREIGN PATENT DOCUMENTS

| | | | |
|---|---|---|---|
| JP | 2003-059948 A | | 2/2003 |
| JP | 2003-060234 A | | 2/2003 |

(Continued)

OTHER PUBLICATIONS

Japanese Office Action dated Apr. 1, 2014, issued in corresponding Japanese application No. 2010-150059, w/ English translation (5 pages).

*Primary Examiner* — Julio J Maldonado
*Assistant Examiner* — Jaehwan Oh
(74) *Attorney, Agent, or Firm* — Westerman, Hattori, Daniels & Adrian, LLP

(57) ABSTRACT

A semiconductor device includes a Si substrate having a principal plane that is a crystal surface inclined at an off angle of 0.1 degrees or less with respect to a (111) plane, an AlN layer that is provided so as to contact the principal plane of the Si substrate and is configured so that an FWHM of a rocking curve of a (002) plane by x-ray diffraction is not greater than 2000 seconds, and a GaN-based semiconductor layer formed on the AlN layer.

17 Claims, 5 Drawing Sheets

(56) References Cited

U.S. PATENT DOCUMENTS

| | | | |
|---|---|---|---|
| 2006/0183625 A1* | 8/2006 | Miyahara | 501/98.4 |
| 2006/0255363 A1 | 11/2006 | Shibata | |
| 2007/0087492 A1* | 4/2007 | Yamanaka | 438/166 |
| 2008/0076200 A1 | 3/2008 | Kobayakawa et al. | |
| 2008/0169483 A1* | 7/2008 | Kasai et al. | 257/183 |
| 2008/0191203 A1* | 8/2008 | Fujioka et al. | 257/43 |
| 2008/0210949 A1* | 9/2008 | Makabe et al. | 257/76 |
| 2008/0224268 A1* | 9/2008 | Abe et al. | 257/615 |
| 2009/0127564 A1* | 5/2009 | Irikura et al. | 257/76 |
| 2009/0155580 A1* | 6/2009 | Shibata et al. | 428/336 |
| 2009/0189188 A1* | 7/2009 | Matsushita | 257/192 |
| 2009/0189192 A1* | 7/2009 | Lieten et al. | 257/200 |
| 2010/0093124 A1* | 4/2010 | Koukitu et al. | 438/46 |
| 2010/0210089 A1* | 8/2010 | Kasai et al. | 438/458 |
| 2011/0017998 A1* | 1/2011 | Nakano et al. | 257/66 |
| 2011/0089520 A1* | 4/2011 | Lieten et al. | 257/472 |
| 2011/0121310 A1* | 5/2011 | Park | 257/76 |
| 2012/0001195 A1* | 1/2012 | Makabe et al. | 257/76 |
| 2012/0119219 A1* | 5/2012 | Takado et al. | 257/76 |
| 2013/0043442 A1* | 2/2013 | Konno et al. | 252/521.3 |

FOREIGN PATENT DOCUMENTS

| | | |
|---|---|---|
| JP | 2006-093400 A | 4/2006 |
| JP | 2006-108656 A | 4/2006 |
| JP | 2006-319107 A | 11/2006 |
| JP | 2008-166349 A | 7/2008 |

* cited by examiner

US 8,754,419 B2

SEMICONDUCTOR DEVICE

CROSS-REFERENCE TO RELATED APPLICATION

This application is based upon and claims the benefit of priority of the prior Japanese Patent Application No. 2010-150059 filed on Jun. 30, 2010, the entire contents of which are incorporated herein by reference.

BACKGROUND (i) Technical Field

A certain aspect of the embodiments discussed herein relates to a semiconductor device. Another aspect of the embodiments relates to a semiconductor device having a GaN-based (gallium nitride based) semiconductor layer formed on a silicon (Si) substrate.

(ii) Related Art

Semiconductor devices using a GaN-based semiconductor are used as a power device operating at high frequencies and outputting high power. There is known an FET such as a high electron mobility transistor (HEMT) as a semiconductor device suitable for a high-frequency band such as a microwave band, a quasi-millimeter band or a millimeter band.

Generally, a sapphire substrate or a silicon carbide (SiC) substrate is used as a substrate on which the GaN-based semiconductor layer is grown. Since the sapphire substrate and the SiC substrate are expensive, there has been developed an art of growing the GaN-based semiconductor layer on the Si substrate. As Si and Ga react easily, in the process of growing the GaN layer on the Si substrate, an AlN layer is interposed between the Si substrate and the GaN-based semiconductor layer as a barrier layer.

However, when the GaN layer is grown directly on the AlN layer, the substrate may be warped, and a GaN layer having no crack may not be obtained. With the above in mind, there has been developed an art of interposing an AlGaN layer between the AlN layer and the GaN layer. For example, Japanese Patent Application Publication 2008-166349 discloses an art of restricting the Al composition ratio of the AlGaN layer to realize a substrate having a good crystal quality and a reduced warp.

In a case where the GaN-based semiconductor device is grown on the AlN layer on the Si substrate, the GaN-based semiconductor layer is not formed as a single crystal and an aggregation of crystals having a constant grain size. Since each grain has a rotated or inclined crystal axis, crystals having different crystal axes form a junction at the grain boundary. Therefore, a crystal deformation, defect or transition tends to occur. Thus, the characteristics of the GaN-based semiconductor device are degraded.

Degradation of the characteristics of the GaN-based semiconductor layer may be prevented by suppressing the occurrence of a crystal deformation, defect or transition. This may be done by reducing the number of grain boundaries. This may be achieved by increasing the grain size and reducing the density of grain boundaries.

SUMMARY

According to an aspect of the present invention, there is provided a semiconductor device including: a Si substrate having a principal plane that is a crystal surface inclined at an off angle of 0.1 degrees or less with respect to a (111) plane; an AlN layer that is provided so as to contact the principal plane of the Si substrate and is configured so that an FWHM of a rocking curve of a (002) plane by x-ray diffraction is not greater than 2000 seconds; and a GaN-based semiconductor layer formed on the AlN layer.

DETAILED DESCRIPTION

FIRST, A DESCRIPTION IS GIVEN OF AN EXPERIMENT FOR INCREASING THE GRAIN SIZE OF THE GAN-BASED SEMICONDUCTOR LAYER. The inventors investigated the influence of the off angle of the Si substrate to the grain size of the GaN-based semiconductor layer.

Figure 1:
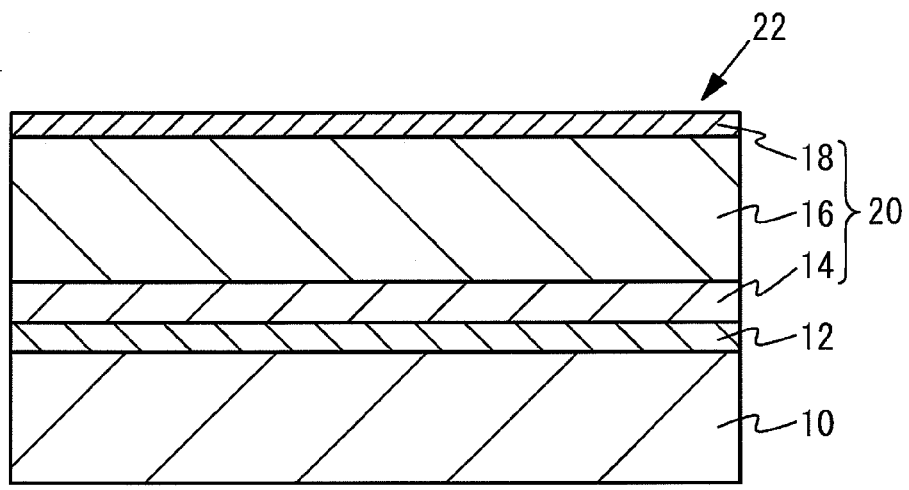
FIG. 1 is a schematic cross-sectional view that illustrates a method for producing a semiconductor epi-substrate configured so that an AlN layer is formed on a Si substrate and a GaN-based semiconductor layer is formed on the AlN layer.

FIG. 1 is a cross-sectional view that describes a process for producing a semiconductor epi-substrate in which a GaN-based semiconductor layer is formed on an AlN layer on a Si substrate. FIG. 1 illustrates an exemplary semiconductor epi-substrate used for HEMT. In the experiment, three different type of Si substrates were prepared. A first type of Si substrate has a principal plane that is a crystal surface inclined at an off angle of 0.06 degrees with respect to the (111) plane. A second type of Si substrate has a principal plane that is a crystal surface inclined at an off angle of 0.33 degrees with respect to the (111) plane. A third type of Si substrate has a principal plane that is a crystal surface inclined at an off angle of 0.67 degrees with respect to the (111) plane. The directions of the inclined off angles of the three types are in a (011) direction from the (111) plane. The following fabrication process was carried out for the three types of Si substrates 10.

The Si substrates 10 were treated by diluted hydrofluoric acid to remove a naturally oxidized film on the surfaces of the Si substrates 10. Next, the Si substrates 10 were placed in a MOCVD (Metal Organic Chemical Vapor Deposition) apparatus. The substrate temperature was heated up to 1100° C., and NH$_3$ (ammonia) and TMA (trimethylaluminium) were supplied to form an AlN layer 12 having a thickness of 300 nm on the principal plane of the Si substrates 10. The rate of growing the AlN layer 12 was 1.5 angstroms/sec.

Then, NH$_3$, TMA and TMG (trimethylgallium) were supplied to grow an AlGaN buffer layer 14 having a thickness of 300 nm and an Al composition ratio of 0.5 on the AlN layer 12, while the substrate temperature was kept at 1100° C. Thereafter, NH₃ and TMG were supplied to a GaN channel layer 16 having a thickness of 1200 nm on the AlGaN buffer layer 14, while the substrate temperature was kept at 1100° C. Then, NH₃, SiH₄ (monosilane), TMG and TMA were supplied to form a Si doped AlGaN (n-type AlGaN) electron supply layer 18 having a thickness of 25 nm and an Al composition ratio of 0.2. The growth pressure was 10 kPa, and the V/III ratio was 30000.

Through the above process, a semiconductor epi-substrate 22 is produced. The semiconductor epi-substrate 22 is configured so that the AlN layer 12 is provided in contact with the principal plane of the Si substrate 10, and the AlGaN buffer layer 14, the GaN channel layer 16 and the AlGaN electron supply layer 18 are stacked on the AlN layer 12 in this order.

Figure 2:
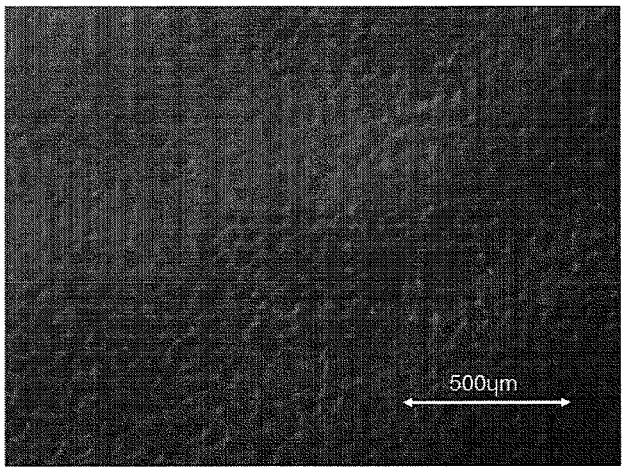
FIG. 2 is a differential interference micrograph of a surface condition of an AlGaN electron supply layer for an off angle of 0.67.
Figure 3:
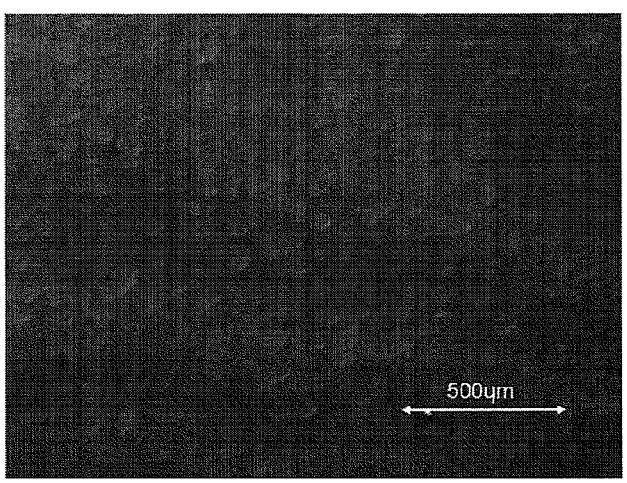
FIG. 3 is a differential interference micrograph of a surface condition of an AlGaN electron supply layer for an off angle of 0.33.
Figure 4:
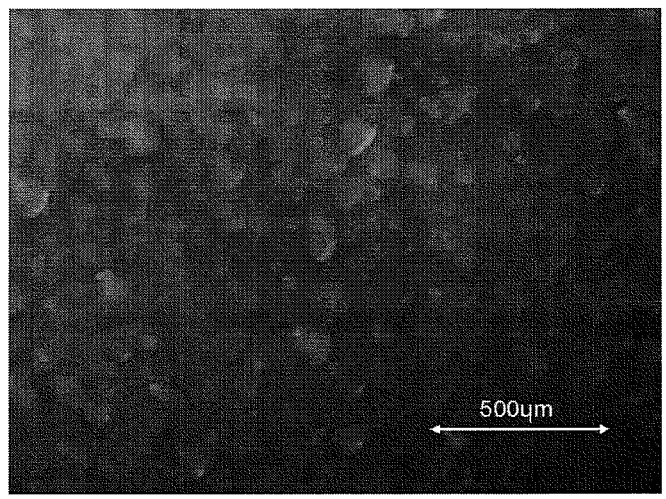
FIG. 4 is a differential interference micrograph of a surface condition of an AlGaN electron supply layer for an off angle of 0.06.
Figure 5:
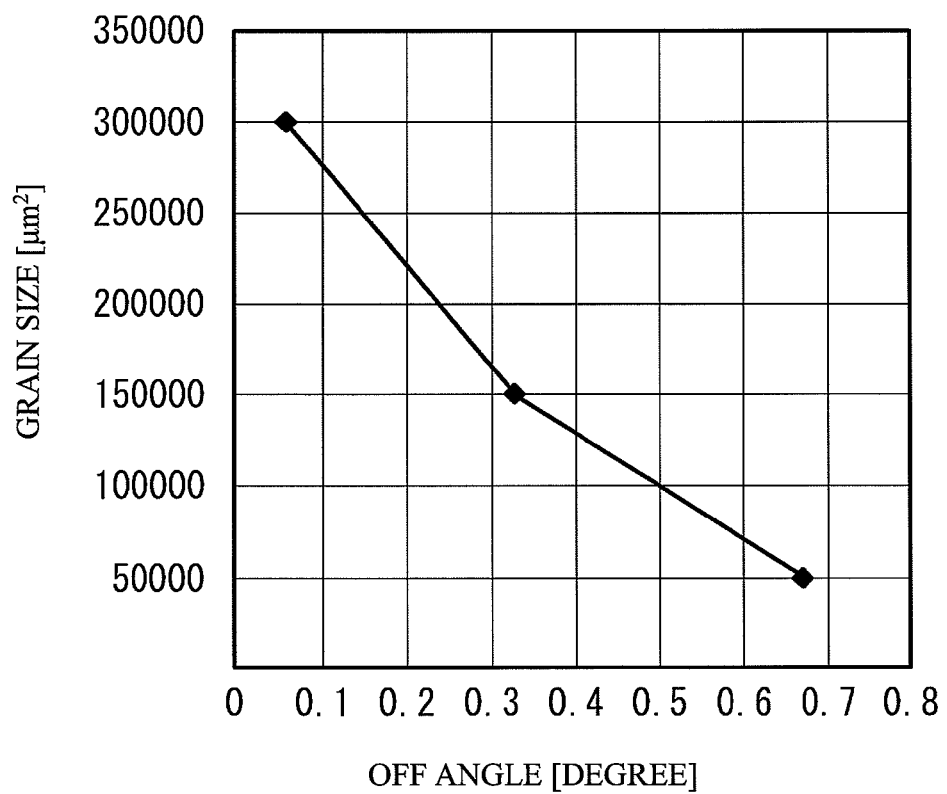
FIG. 5 is a graph of a correlation between the average grain size and the off angle of the Si substrate.

The surface condition of each of the AlGaN electron supply layers 18 of the three types of semiconductor epi-substrates 22 produced by the above process was observed by a differential interference microscope, and the average grain sizes thereof were obtained through the observed results. FIGS. 2, 3 and 4 are respectively differential interference micrographs for off angles of 0.67, 0.33 and 0.06. FIG. 5 is a graph of a correlation between the average of the grain sizes obtained in FIGS. 2 through 4 and the off angle of the Si substrate 10. As indicated in FIG. 5, the average grain size of the Si substrate 10 having the principal plane that is the crystal surface inclined at an off angle of 0.67 degrees with respect to the (111) plane is 50000 $\mu m^2$. The average grain size of the Si substrate 10 having the principal plane that is the crystal surface inclined at a decreased off angle of 0.33 degrees with respect to the (111) plane is 150000 $\mu m^2$. The average grain size of the Si substrate 10 having the principal plane that is the crystal surface inclined at a further decreased off angle of 0.06 degrees with respect to the (111) plane is 300000 $\mu m^2$. It can be seen from the above that the grain size of the AlGaN electron supply layer 18 can be increased by using the Si substrate 10 having the principal plane that is a crystal surface inclined at a small off angle with respect to the (111) plane. This may be explained so that the surface of the Si substrate 10 more steps as the off angle increases and these steps lead to transitions.

A tendency such that the grain size is greater as the off angle with respect to the (111) plane is smaller is observed in another case where the direction of the inclined off angle is different from the above-mentioned direction. That is, the grain size tends to increase as the absolute value of the off angle with respect to the (111) plane decreases.

Next, the inventors investigated the influence of the crystal quality of the AlN layer 12 to the grain size of the GaN-based semiconductor layer. The crystal quality of the AlN layer 12 depends on the rate of growing the AlN layer 12. Thus, the crystal quality of the AlN layer 12 was changed by changing the growth rate of the AlN layer 12. More specifically, in the process of growing the AlN layer 12 previously described with reference to FIG. 1, semiconductor epi-substrates having different crystal qualities of the AlN layer 12 were produced by setting the growth rate of the AlN layer 12 to 5 angstroms/sec and 15 angstroms/sec. For both rates of 5 angstroms/sec and 15 angstroms/sec, the Si substrates 10 had the principal plane that is the crystal surface inclined at an off angle of 0.06 degrees with respect to the (111) plane.

A description is now given of the crystal qualities of the AlN layers 12 respectively formed at the growth rates of 5 angstroms/sec and 15 angstroms/sec. The crystal qualities of the AlN layers 12 were investigated by checking the FWHM (Full Width at Half Maximum) of a rocking curve of a (002) plane by x-ray diffraction. The FWHM of the rocking curve for a growth rate of 5 angstroms/sec was 2000 seconds, and that for a growth rate of 15 angstroms/sec was 3000 seconds. The FWHM of the rocking curve for a growth rate of 1.5 angstroms/sec previously described with reference to FIG. 1 was 1000 seconds. It can be seen from the above that as the growth rate of the AlN layer 12 becomes higher, the crystal quality of the AlN layer 12 tends to become worse (the FWHM of the rocking curve is greater).

Figure 6:
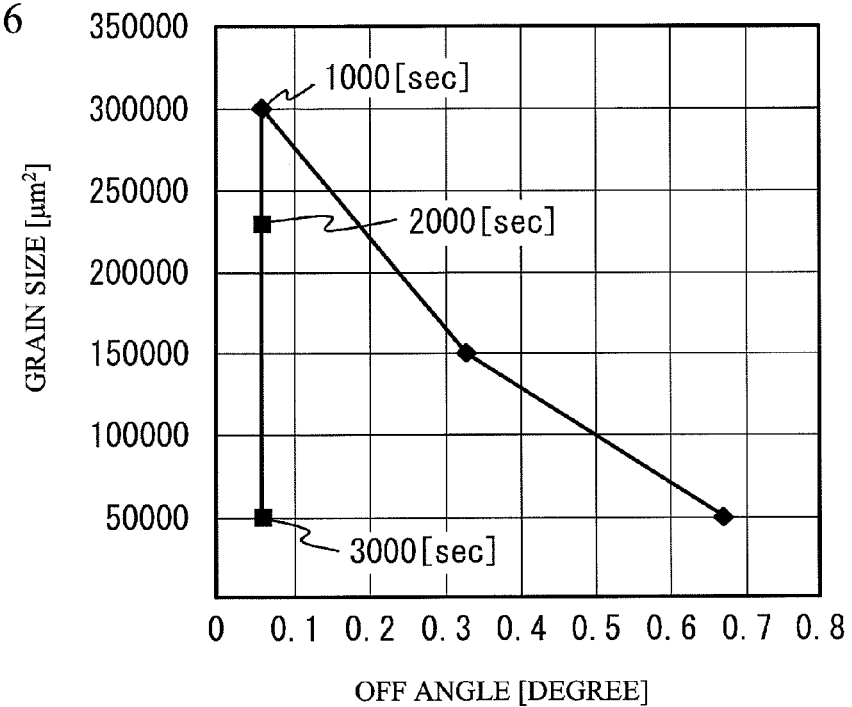
FIG. 6 is a graph of a correlation between the average grain size and the crystal quality of an AlN layer.

The surface condition of each of the AlGaN electron supply layers 18 of the semiconductor epi-substrates 22 respectively produced so that the growth rates of the AlN layer 12 were set to 5 angstroms/sec and 15 angstroms/sec was observed by the differential interference microscope, and the average grain sizes thereof were obtained through the observed results. FIG. 6 is a graph of a correlation between the crystal quality of the AlN layer 12 and the average grain size. It is noted that the crystal quality of the AlN layer 12 and the average grain size illustrated in FIG. 5 are added to FIG. 6. As illustrated in FIG. 6, even in the case where the Si substrate 10 having the principal plane that is the crystal surface inclined at an off angle of 0.06 degrees with respect to the (111) plane, the grain size is 230000 $\mu m^2$ when the FWHM of the rocking curve is 2000 seconds, and is 50000 $\mu m^2$ when the FWHM of the rocking curve is 3000 seconds. It can be seen from the above that as the crystal quality of the AlN layer 12 is degraded, the grain size tends to decrease. Particularly, when the FWHM of the rocking curve becomes greater than 2000 seconds, the grain size decreases drastically. In other words, as the FWHM of the rocking curve is decreased, the grain size can be increased. It is considered that the reason why as grain size decreases as the crystal quality of the AlN layer 12 degrades is the grain sizes observed are those of GaN and the number of boundaries of the GaN crystal depends on the crystal quality of the underlying AlN layer 12.

A tendency such that the grain size decreases as the crystal quality of the AlN layer 12 degrades was observed even in a case where the Si substrates 10 having principal planes that are crystal surfaces inclined at off angles other than 0.06 degrees with respect to the (111) plane. For example, in a case where the Si substrate 10 having the principal plane that is the (111) plane, a similar tendency was observed. Now, a description is given of a semiconductor device having a large grain size of the GaN-based semiconductor layer structured based on the above-described experimental results.

First Embodiment

Figure 7:
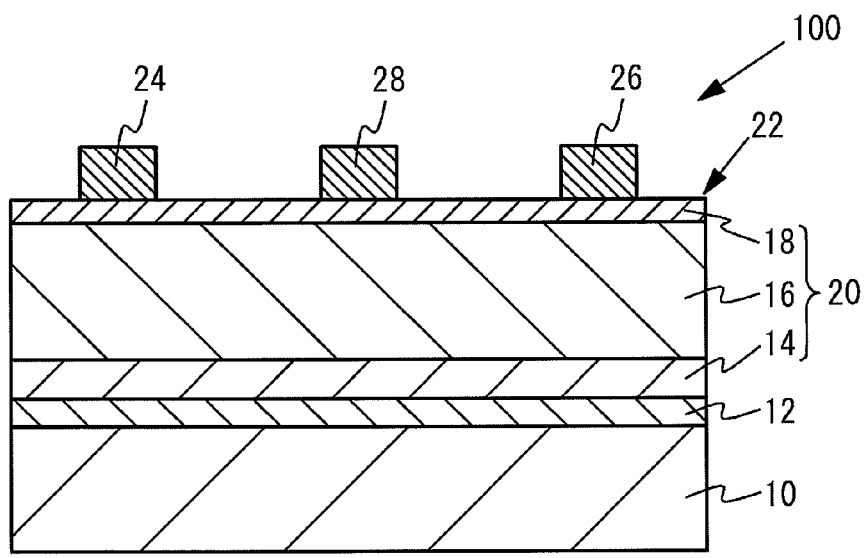
FIG. 7 is a schematic cross-sectional view of a semiconductor device in accordance with a first embodiment.

FIG. 7 is a schematic cross-sectional view of a semiconductor device in accordance with a first embodiment, which is an exemplary HEMT. Referring to FIG. 7, a semiconductor device 100 of the first embodiment has the AlN layer 12 that contacts the principal plane of the Si substrate 10. The principal plane of the Si substrate 10 is a crystal surface inclined at an off angle of 0.06 degrees with respect to the (111) plane. In the AlN layer 12, the FWHM of the rocking curve of the (002) plane by x-ray diffraction is 1000 seconds. The AlN layer 12 may be 300 nm thick, for example.

A GaN-based semiconductor layer 20 is provided on the AlN layer 12. The GaN-based semiconductor layer 20 includes the AlGaN buffer layer 14, the GaN channel layer 16, and the AlGaN electron supply layer 18, which layers are sequentially stacked. More specifically, the GaN channel layer 16 is formed on the AlGaN buffer layer 14, and the AlGaN electron supply layer 18 is formed on the GaN channel layer 16. For example, the AlGaN buffer layer 14 has an Al composition ratio of 0.5, and a thickness of 300 nm. The GaN channel layer 16 may be 1200 nm thick, for example. The AlGaN electron supply layer 18 has an Al composition ratio of 0.2 and a thickness of 25 nm, for example.

As described above, the semiconductor epi-substrate 22 is configured so that the GaN-based semiconductor layer 20 is formed on the AlN 12 on the Si substrate 10. The semiconductor epi-substrate 22 may be produced by the production method previously described with reference to FIG. 1.

A source electrode 24 and a drain electrode 26 are provided on the AlGaN electron supply layer 18 as ohmic electrodes. Each of the source electrode 24 and the drain electrode 26 on the AlGaN electron supply layer 18 may be formed by stacking Ti (titanium) and Au (gold) in this order. A gate electrode 28 is formed on the AlGaN electron supply layer 18 as a Schottky electrode. The gate electrode 28 on the AlGaN electron supply layer 18 may be formed by sequentially stacking Ni and Au in this order. That is, a Schottky potential is applied via the Schottky junction. The source electrode 24 and the drain electrode 26 are ohmic electrodes formed by depositing Ti and Au by a vapor deposition method and keeping the Ti/Au layer at 700° C. for 5 minutes to form an alloy thereof.

As described above, the semiconductor device 100 of the first embodiment uses the Si substrate 10 having the principal plane that is the crystal surface inclined at an off angle of 0.06 degrees with respect to the (111) plane, and has a crystal quality of the AlN layer 12 so that the FWHM of the rocking curve of the (002) plane by x-ray diffraction is 1000 seconds. Thus, the grain size of the AlGaN electron supply layer 18 is as large as 300000 $\mu m^2$.

The inventors investigated the Schottky characteristic of the gate of the semiconductor device of the first embodiment. For the purpose of comparison, the inventors investigated the Schottky characteristics of the gates of semiconductor devices in accordance with first and second comparative examples having gate sizes different from that of the AlGaN electron supply layer 18 of the first embodiment. The semiconductor device of the first comparative example uses the Si substrate 10 having the principal plane that is the crystal surface inclined at an off angle of 0.33 degrees with respect to the (111) plane. The semiconductor device of the second comparative example uses the Si substrate 10 having the principal plane that is the crystal surface inclined at an off angle of 0.67 degrees with respect to the (111) plane. Except the off angles, the first and second comparative examples are fabricated by the same method as that of the first embodiment, and has the same structure as that of the first embodiment. Thus, as illustrated in FIG. 5, the grain size of the AlGaN electron supply layer 18 of the first comparative example is 150000 $\mu m^2$, and the grain size of the AlGaN electron supply layer 18 of the second comparative example is 50000 $\mu m^2$.

Figure 8:
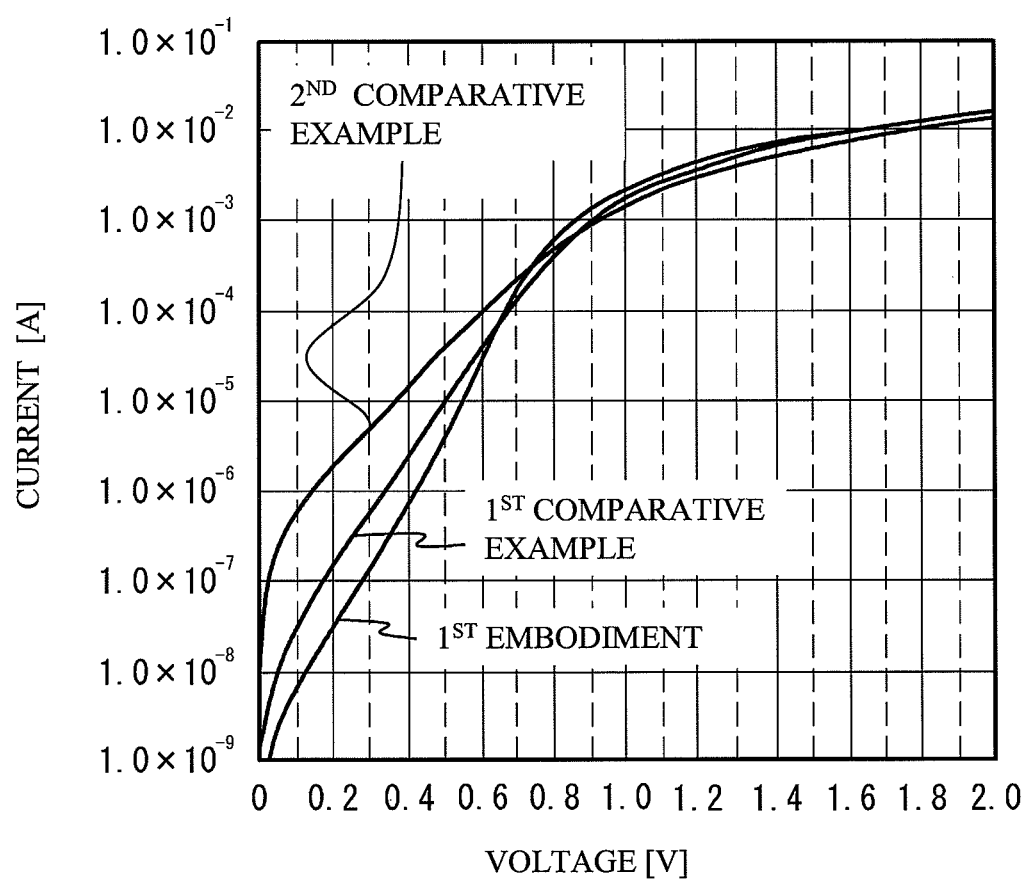
FIG. 8 is a graph of current-voltage characteristics of gates of semiconductor devices configured in accordance with a first embodiment and first and second comparative examples.

FIG. 8 is a graph of current-voltage characteristics of the gates of the semiconductor devices of the first embodiment, the first comparative example, and the second comparative example. As illustrated in FIG. 8, a fine bias leakage current for 0.1 V decreases in the order of the second comparative example, the first comparative example, and the first embodiment. That is, as the grain size of the AlGaN electron supply layer 18 becomes greater, the fine bias leakage current becomes smaller. For example, the fine bias leakage current for 0.1 V of the second comparative example is $9.0 \times 10^{-7}$ A, and the first embodiment has an improved value of $9.0 \times 10^{-9}$ A. It is considered that the reason why the fine bias leakage current decreases as the grain size increases is that an increase in the grain size reduces the density at grin boundaries and reduces crystal defects at the interface between the AlGaN electron supply layer 18 and the gate electrode 28.

As described above, the semiconductor device 100 of the first embodiment has the Si substrate 10 having the principal plane that is the crystal surface inclined at an off angle of 0.06 degrees with respect to the (111) plane, and the AlN layer 12 that is provided in contact with the principal plane of the Si substrate 10 and is configured so that the FWHM of the rocking curve of the (002) plane by x-ray diffraction is 1000 seconds. The GaN-based semiconductor layer 20 composed of the AlGaN buffer layer 14, the GaN channel layer 16 and the AlGaN electron supply layer 18 is provided on the AlN layer 12. It is thus possible to increase the grain size of the AlGaN electron supply layer 18 as illustrated in FIG. 5 and to improve the leakage current characteristic as illustrated in FIG. 8.

The principal plane of the Si substrate 10 in the first embodiment is the crystal surface inclined at an off angle of 0.06 degrees with respect to the (111) plane. However, the principal plane is not limited to the above. As has been described with reference to FIG. 5, the grain size of the AlGaN electron supply layer 18 can be increased by using the Si substrate 10 having the principal plane that is a crystal surface inclined at a small off angle with respect to the (111) plane. Thus, taking required electric characteristics into consideration, it is possible to use the Si substrate 10 having the principal plane that is the crystal surface inclined at an off angle of 0.1 degrees or less with respect to the (111) plane.

In order to further increase the grain size and further improve the leakage current characteristic, it is more preferable to use the Si substrate 10 having the principal plane that is the crystal surface inclined at an off angle of 0.06 degrees or less with respect to the (111) plane, and is more preferable to use the Si substrate 10 having the principal plane that is the (111) plane.

In the above-described first embodiment, the AlN layer 12 provided so as to contact the principal plane of the Si substrate 10 is configured so that the FWHM of the rocking curve of the (002) plane by x-ray diffraction is 1000 seconds. However, the AlN layer 12 is not limited to the above. As has been described with respect to FIG. 6, as the AlN layer 12 has a better crystal quality, the grain size of the AlGaN electron supply layer 18 increases. In other words, as the FWHM of the rocking curve of the (002) plane by x-ray diffraction is smaller, the grain size of the AlGaN electron supply layer 18 is greater. Thus, taking the required electric characteristics into consideration, the AlN layer 12 may be configured that the FWHM of the rocking curve of the (002) plane by x-ray diffraction is not greater than 2000 seconds. In order to further increase the grain size and further improve the leakage current, it is more preferable that the FWHM is not greater than 1000 seconds.

As has been described with reference to FIG. 8, as the grain size of the AlGaN electron supply layer 18 increases, the crystal defects at the interface between the AlGaN electron supply layer 18 and the gate electrode 28 reduce and the leakage current characteristic is improved. Thus, the grain size of the AlGaN electron supply layer 18 is preferably greater than or equal to 250000 $\mu m^2$ and is more preferably not less than 270000 $\mu m^2$, and is much more preferably not less than 300000 $\mu m^2$.

In the above description of the first embodiment, the AlN layer 12 is 300 nm thick. However, the thickness of the AlN layer 12 is not limited to the above but may preferably be not less than 100 nm and not greater than 500 nm. In case where the AlN layer 12 has a thickness of not greater than 100 nm, it becomes difficult to secure the appropriate breakdown voltage. In contrast, in case where the AlN layer has a thickness of not less than 500 nm, stress increases and the substrate may be broken. Thus, in order to secure the appropriate breakdown voltage and suppress a break of the substrate, the thickness of the AlN layer 12 is preferably not less than 100 nm and not greater than 500 nm, and is more preferably not less than 200 nm and not greater than 400 nm.

The GaN-based semiconductor described in the first embodiment is a semiconductor including GaN, and includes, besides GaN and AlGaN, InGaN (a mixed crystal of GaN and InN (indium nitride) and AlInGaN (a mixed crystal of GaN, AlN and InN). Thus, the GaN-based semiconductor layer 20 may include a GaN-based semiconductor as described above besides GaN and AlGaN.

Figure 9A:
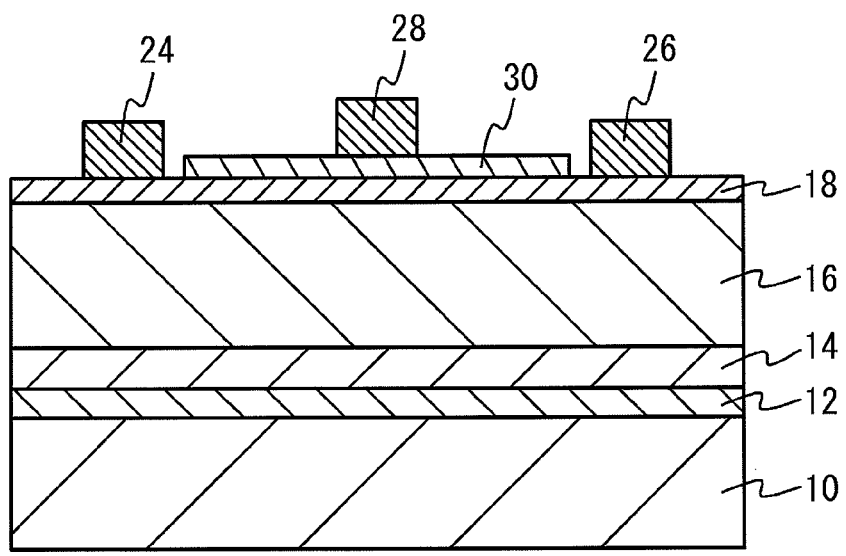
FIG. 9A is a schematic cross-sectional view of a MISFET.
Figure 9B:
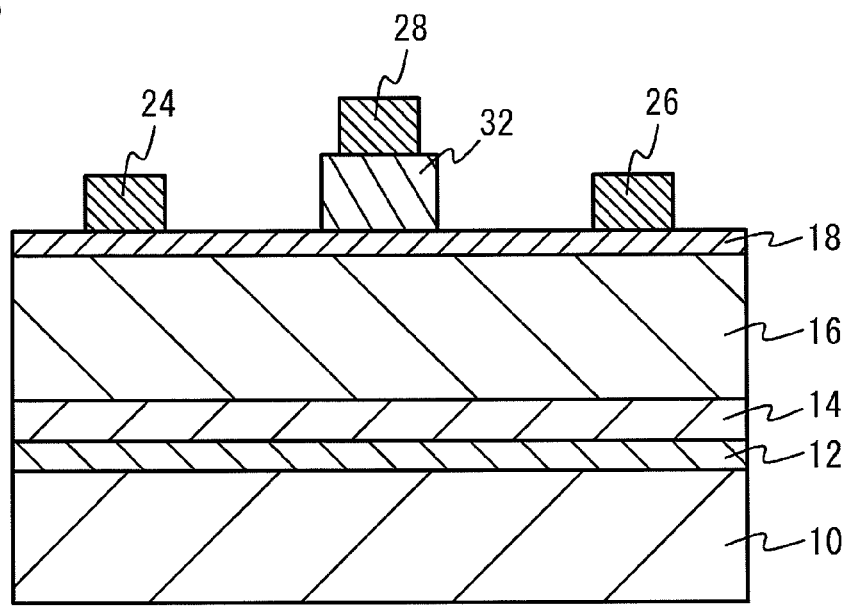
FIG. 9B is a schematic cross-sectional view of a junction-type FET.

The first embodiment is an exemplary HEMT. However, the first embodiment may be an FET other than the HEMT. For example, the first embodiment may be a MISFET as illustrated in FIG. 9A or a junction FET as illustrated in FIG. 9B. Referring to FIG. 9A, the MISFET is configured so that a gate insulation film 30 is formed on the AlGaN electron supply layer 18, and the gate electrode 28 is formed on the gate insulation film 30. Thus, the gate potential is applied via the gate insulation film 30. The gate insulation film 30 may be made of SiN (silicon nitride), $SiO_2$ (silicon oxide), $Al_2O_3$ (aluminum oxide). A stacked layer structure from the Si substrate 10 to the AlGaN electron supply layer 18 of the MISFET, and the structures of the electrodes on the AlGaN electron supply layer 18 are the same as those illustrated in FIG. 7, and a description thereof is omitted here. Referring to FIG. 9B, the junction FET is configured so that a barrier layer 32 and the gate electrode 28 are stacked in this order on the AlGaN electron supply layer 18. The barrier layer 32 may be made of p-type GaN or p-type AlGaN. Thus, the gate electric field is applied via the pn junction. The stacked layer structure from the Si substrate 10 to the AlGaN electron supply layer 18 and the structures of the electrodes on the AlGaN electron supply layer 18 are the same as those illustrated in FIG. 7, and a description thereof is omitted here.

Even in the MISFET and the junction FET respectively in FIGS. 9A and 9B, the electric characteristics thereof can be improved by using the semiconductor epi-substrate that is structured so that the AlN layer configured so that the FWHM of the rocking curve of the (002) plane by x-ray diffraction is not greater than 2000 seconds is provided so as to contact the principal plane of the Si substrate that is the crystal surface inclined at an off angle of 0.1 degrees or less with respect to the (111) plane, and the GaN-based semiconductor layer is formed on the AlN layer.

The present invention is not limited to the specifically described embodiments, but have other embodiments and variations within the scope of the claimed invention.

What is claimed is:

1. A semiconductor device comprising:
    a Si substrate having a principal plane that is a crystal surface inclined at an off angle of 0.1 degrees or less and 0.06 degrees or greater with respect to a (111) plane;
    an AlN layer that is provided so as to contact the principal plane of the Si substrate and is configured so that a Full Width Half Maximum (FWHM) of a rocking curve of a (002) plane by x-ray diffraction is not less than 1000 seconds and is not greater than 2000 seconds; and
    a GaN-based semiconductor layer formed on the AlN layer.

2. The semiconductor device according to claim 1, wherein the AlN layer has a thickness that is not less than 100 nm and is not greater than 500 nm.

3. The semiconductor device according to claim 1, wherein the GaN-based semiconductor layer has a grain size of not less than 250000 $\mu m^2$.

4. The semiconductor device according to claim 1, wherein the semiconductor device is configured to have one of a structure in which a gate potential is applied via an gate insulation film, another structure in which the gate potential is applied via a Schottky junction and yet another structure in which a gate electric field is applied via a pn junction.

5. The semiconductor device according to claim 1, wherein the GaN-based semiconductor layer comprises of a GaN channel layer and a AlGaN electron supply layer.

6. The semiconductor device according to claim 5, further comprising a gate electrode formed on the AlGaN electron supply layer.

7. The semiconductor device according to claim 5, further comprising a gate insulation film formed on the AlGaN electron supply layer and a gate electrode formed on the gate insulation film.

8. The semiconductor device according to claim 5, further comprising a barrier layer formed on the AlGaN electron supply layer and a gate electrode formed on the barrier layer, the barrier layer comprised of p-type GaN or p-type AlGaN.

9. A semiconductor device comprising:
    a Si substrate having a principal plane that is a crystal surface inclined at an off angle of 0.1 degrees or less with respect to a (111) plane;
    an AlN layer that is provided so as to contact the principal plane of the Si substrate and is configured so that a Full Width Half Maximum (FWHM) of a rocking curve of a (002) plane by x-ray diffraction is not less than 1000 seconds and is not greater than 2000 seconds; and
    a GaN-based semiconductor layer formed on the AlN layer.

10. The semiconductor device according to claim 1, wherein the principal plane of the Si substrate is the (111) plane.

11. The semiconductor device according to claim 1, wherein the AlN layer has a thickness that is not less than 100 nm and is not greater than 500 nm.

12. The semiconductor device according to claim 1, wherein the GaN-based semiconductor layer has a grain size of not less than 250000 $\mu m^2$.

13. The semiconductor device according to claim 1, wherein the semiconductor device is configured to have one of a structure in which a gate potential is applied via a gate insulation film, another structure in which the gate potential is applied via a Schottky junction and yet another structure in which a gate electric field is applied via a pn junction.

14. The semiconductor device according to claim 1, wherein the GaN-based semiconductor comprises a GaN channel layer and an AlGaN electron supply layer.

15. The semiconductor device according to claim 5, further comprising a gate electrode formed on the AlGaN electron supply layer.

16. The semiconductor device according to claim 5, further comprising a gate insulation film formed on the AlGaN electron supply layer and a gate electrode formed on the gate insulation film.

17. The semiconductor device according to claim 5, further comprising a barrier layer formed on the AlGaN electron supply layer and a gate electrode formed on the barrier layer, the barrier layer comprised of p-type GaN or p-type AlGaN.

* * * * *